(12) United States Patent
Chang et al.

(10) Patent No.: US 9,142,529 B2
(45) Date of Patent: Sep. 22, 2015

(54) CHIP PACKAGE WITH IMPROVED HEAT DISSIPATION AND MANUFACTURING METHOD THEREOF

(71) Applicants: Yi-Chang Chang, Hsin-Chu (TW); Yen-Hsin Chen, Hsin-Chu (TW); Chi-Chih Shen, Hsin-Chu (TW)

(72) Inventors: Yi-Chang Chang, Hsin-Chu (TW); Yen-Hsin Chen, Hsin-Chu (TW); Chi-Chih Shen, Hsin-Chu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 0 days.

(21) Appl. No.: 14/163,569

(22) Filed: Jan. 24, 2014

(65) Prior Publication Data

US 2014/0210069 A1    Jul. 31, 2014

(30) Foreign Application Priority Data

Jan. 31, 2013    (TW) .............................. 102103806 A

(51) Int. Cl.
*H01L 23/498*    (2006.01)
*H01L 23/34*    (2006.01)
(Continued)

(52) U.S. Cl.
CPC ............ *H01L 24/81* (2013.01); *H01L 23/3114* (2013.01); *H01L 23/3192* (2013.01); *H01L 23/36* (2013.01); *H01L 23/3677* (2013.01); *H01L 27/14618* (2013.01); *H01L 24/05* (2013.01); *H01L 24/13* (2013.01); *H01L 29/0657* (2013.01); *H01L 2224/02371* (2013.01); *H01L 2224/0401* (2013.01); *H01L 2224/05022* (2013.01); *H01L 2224/05548* (2013.01); *H01L 2224/05567* (2013.01); *H01L 2224/131* (2013.01); *H01L 2224/13022* (2013.01); *H01L 2224/17519* (2013.01);

(Continued)

(58) Field of Classification Search
CPC ... H01L 23/49816; H01L 23/34; H01L 24/81; H01L 27/14618; H01L 23/3677; H01L 23/36; H01L 23/3192; H01L 23/3114; H01L 2224/32245; H01L 2224/17519; H01L 2224/38247; H01L 2224/48247; H01L 2224/48465; H01L 2224/73265; H01L 2224/48091; H01L 29/0657; H01L 2224/13022; H01L 2224/05567
USPC ......... 257/712, 707, 704, 708, 710, 713, 717, 257/720, 675, 778, 734, 737, 738, 532, 531, 257/528, 659, 774; 361/705, 706, 719
See application file for complete search history.

(56) References Cited

U.S. PATENT DOCUMENTS 7,372,122 B2*    5/2008  Kang ............................ 257/433
2006/0171698 A1*    8/2006  Ryu et al. ..................... 396/114

(Continued)

FOREIGN PATENT DOCUMENTS

TW    I289545    10/2002

*Primary Examiner* — Alexander Oscar Williams
(74) *Attorney, Agent, or Firm* — Tung & Associates

(57) ABSTRACT

A chip package includes: a semiconductor chip having an upper surface and a lower surface opposite to each other, the semiconductor chip including an image sensor circuit; a metal heat conductive layer formed on the lower surface, for conducting or absorbing heat generated by the semiconductor chip; a bond pad formed on the upper surface, for electrically connecting with the image sensor circuit in the semiconductor chip, wherein the metal heat conductive layer conducts or absorbs heat generated by the semiconductor chip, to thereby reduce temperature of the image sensor circuit in the semiconductor chip and improve the performance of the circuit, wherein the metal heat conductive layer entirely covers the lower surface.

9 Claims, 4 Drawing Sheets

(51) Int. Cl.
*H01L 23/00* (2006.01)
*H01L 23/31* (2006.01)
*H01L 23/36* (2006.01)
*H01L 23/367* (2006.01)
*H01L 27/146* (2006.01)
*H01L 29/06* (2006.01)

(52) U.S. Cl.
CPC ............ *H01L 2224/32245* (2013.01); *H01L 2224/48091* (2013.01); *H01L 2224/48247* (2013.01); *H01L 2224/48465* (2013.01); *H01L 2224/73265* (2013.01)

(56) References Cited

U.S. PATENT DOCUMENTS

| | | | |
|---|---|---|---|
| 2008/0182355 A1* | 7/2008 | Liu | 438/64 |
| 2010/0252902 A1* | 10/2010 | Tanida et al. | 257/433 |
| 2011/0278724 A1* | 11/2011 | Lin et al. | 257/738 |
| 2011/0291215 A1* | 12/2011 | Tu et al. | 257/433 |
| 2012/0049307 A1* | 3/2012 | Huang et al. | 257/432 |
| 2012/0181672 A1* | 7/2012 | Lou et al. | 257/621 |
| 2013/0045549 A1* | 2/2013 | Shiu et al. | 438/27 |
| 2013/0119524 A1* | 5/2013 | Chan | 257/668 |
| 2013/0119556 A1* | 5/2013 | Liu et al. | 257/774 |
| 2013/0153933 A1* | 6/2013 | Lee et al. | 257/82 |
| 2013/0161778 A1* | 6/2013 | Lin et al. | 257/460 |
| 2013/0224912 A1* | 8/2013 | Ihara et al. | 438/122 |
| 2013/0258599 A1* | 10/2013 | Danello et al. | 361/706 |
| 2014/0048950 A1* | 2/2014 | Lin et al. | 257/774 |
| 2014/0063742 A1* | 3/2014 | Carpenter et al. | 361/705 |
| 2014/0084458 A1* | 3/2014 | Huang et al. | 257/737 |
| 2014/0239464 A1* | 8/2014 | Chung et al. | 257/659 |
| 2014/0263958 A1* | 9/2014 | Her et al. | 250/208.1 |
| 2014/0284764 A1* | 9/2014 | Lee | 257/532 |
| 2014/0332908 A1* | 11/2014 | Ho et al. | 257/414 |

* cited by examiner

CHIP PACKAGE WITH IMPROVED HEAT DISSIPATION AND MANUFACTURING METHOD THEREOF

CROSS REFERENCE

The present invention claims priority to TW 102103806, filed on Jan. 31, 2013.

BACKGROUND OF THE INVENTION

1. Field of Invention

The present invention relates to a chip package and a manufacturing method thereof; particularly, it relates to such chip package with a function of heat sink and a manufacturing method thereof.

2. Description of Related Art

FIG. 1 shows a schematic diagram of a prior art chip package 1 from cross-section view. As shown in FIG. 1, the chip package 1 for example is an image sensor chip package, which includes: a semiconductor chip 11, a bond pad 12, a chamber wall 13, an optical glass 14, an electrical conductive pad 15, an electrical conductive wire 16, a barrier solder mask 17, solder balls 18, and a solder mask face 19. An optical image signal passes through the optical glass 14 and a cavity formed by the chamber wall 13 to enter the semiconductor chip 11. The optical image signal is converted to an electronic signal by a circuit operating in the semiconductor chip 11, and the electronic signal is delivered from the bond pad 12, via the conductive pad 15, the conductive wire 16, and the solder balls 18, to a printed circuit board (PCB, not shown).

When the circuit in the semiconductor substrate 11 operates, heat is generated. The chip package 1 for example is a chip scale package (CSP), and such heat dissipation issue will impact the performance of the semiconductor chip 11, generating noises in the optical image signal, and even damaging the chip package 1 in a severe situation.

In view of above, to overcome the drawbacks in the prior art, the present invention proposes a chip package and a manufacturing thereof, which improves the heat dissipation efficiency of the chip package to reduce the operation temperature and improve the operating performance of the chip.

SUMMARY OF THE INVENTION

From one perspective, the present invention provides a chip package, which includes: a semiconductor chip having an upper surface and a lower surface opposite to each other; a metal heat conductive layer formed on the lower surface, for conducting or absorbing heat generated by the semiconductor chip; and a bond pad formed on the upper surface, for electrically connecting with a circuit in the semiconductor chip.

From another perspective, the present invention provides a manufacturing method of chip package, includes: providing a semiconductor chip having an upper surface and a lower surface opposite to each other; forming a metal heat conductive layer on the lower surface, for conducting or absorbing heat generated by the semiconductor chip; and forming a bond pad on the upper surface, for electrically connecting with a circuit in the semiconductor chip.

In one preferable embodiment, the chip package further includes a metal heat conductive strip, which is connected to the metal heat conductive layer; and a solder ball or a lead, which is coupled to the metal heat conductive strip; whereby heat generated by a circuit of the semiconductor chip is conducted to the solder ball or the lead via the metal heat conductive layer and the metal heat conductive strip.

In the aforementioned embodiment, the solder ball or the lead is preferably electrically connected to a ground level.

In one preferable embodiment, the metal heat conductive layer entirely covers the lower surface.

In one preferable embodiment, the circuit in the semiconductor chip includes an image sensor circuit.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1:
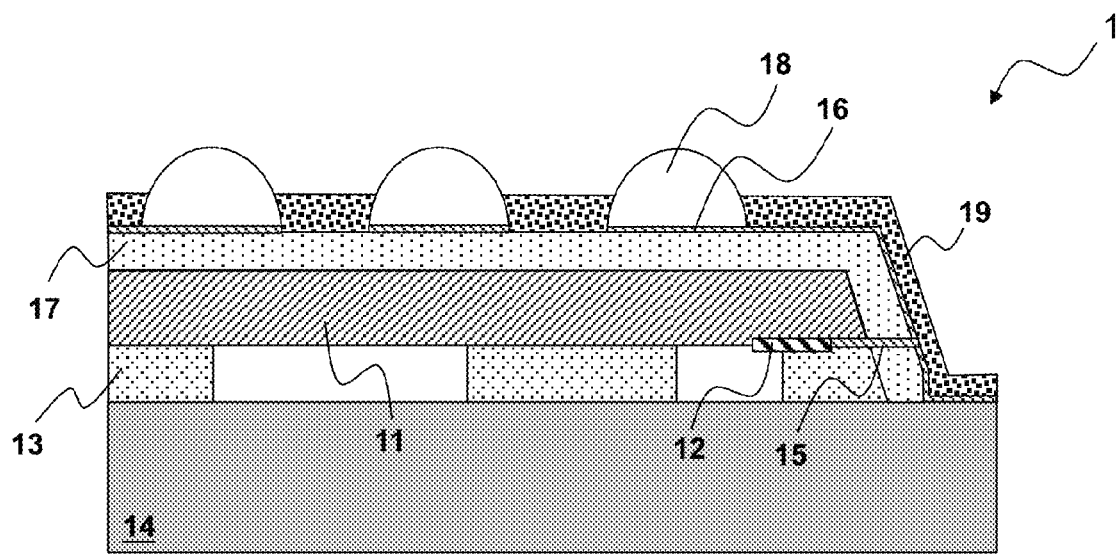
FIG. 1 shows a schematic diagram of a prior art chip package 1 from cross-section view.
Figure 2:
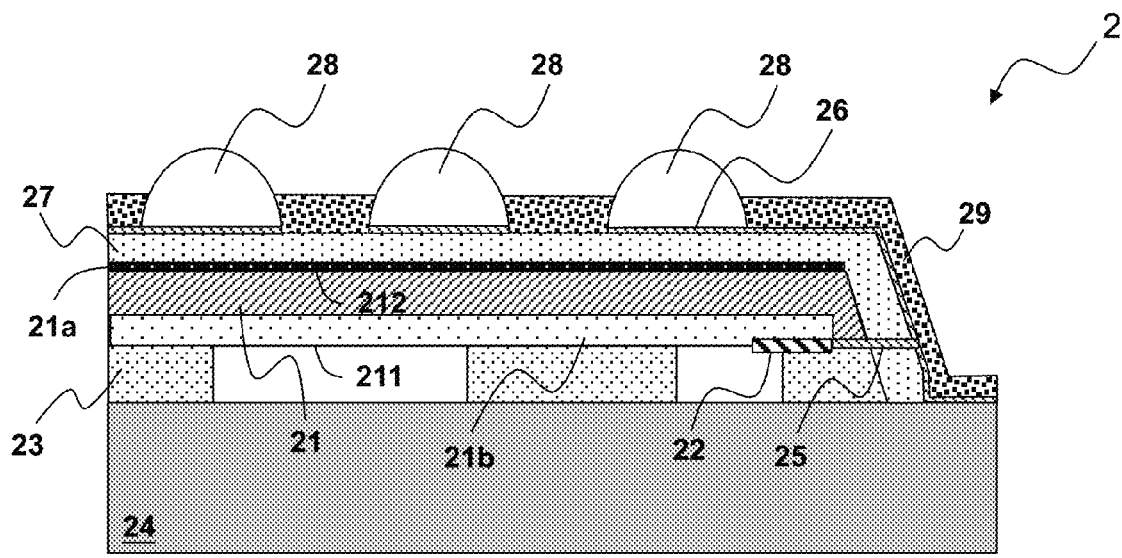
FIG. 2 shows a first embodiment of the present invention.

Please refer to FIG. 2 for a first embodiment according to the present invention. FIG. 2 shows a schematic diagram of a chip package 2 from cross-section view. As shown in FIG. 2, the chip package 2 is for example but not limited to a chip scale package (CSP) including an image sensor circuit 21b. The chip package 2 includes: a semiconductor chip 21, a metal heat conductive layer 21a, a bond pad 22, a chamber wall 23, an optical glass 24, an electrical conductive pad 25, an electrical conductive wire 26, a barrier solder mask 27, solder balls 28, and a solder mask face 29. The semiconductor chip 21 has an upper surface 211 and a lower surface 212. (Because it is customary to call the surface with the circuit on it as "upper surface", so the surface 211 is "upper", even though it is shown in the figure as facing downward.) The bond pad 22 is formed on the upper surface 211, for electrically connecting with a circuit in the semiconductor chip 21. An optical image signal passes through the optical glass 24 and a cavity formed by the chamber wall 23 to enter the semiconductor chip 21. The optical image signal is converted to an electronic signal by the circuit operating in the semiconductor chip 21, and the electronic signal is delivered from the bond pad 22, via the conductive pad 25, the conductive wire 26, and the solder balls 28 to a printed circuit board (PCB, not shown). Note that the solder balls 28 may be replaced by leads or any other electrical connection means in other types of chip package, so the electrical connection is not limited to the form of the solder ball.

This embodiment is different from the prior art in that, in this embodiment, the metal heat conductive layer 21a is formed on the lower surface 212, for conducting or absorbing heat generated by the semiconductor chip 21, to thereby reduce temperature of the circuit in the semiconductor chip 21 and improve the performance of the circuit.

Note that, preferably but not necessarily, the metal heat conductive layer 21a entirely covers the lower surface 212 as shown in the figure. As such, the entire coverage can optimize the performance of heat dissipation. Furthermore, for a CSP in which an image sensor circuit 21b is packaged, this arrangement (the entire coverage) can enhance the optical image signal because it provides a uniform background. This is also an advantage of the present invention over the prior art.

Figure 3:
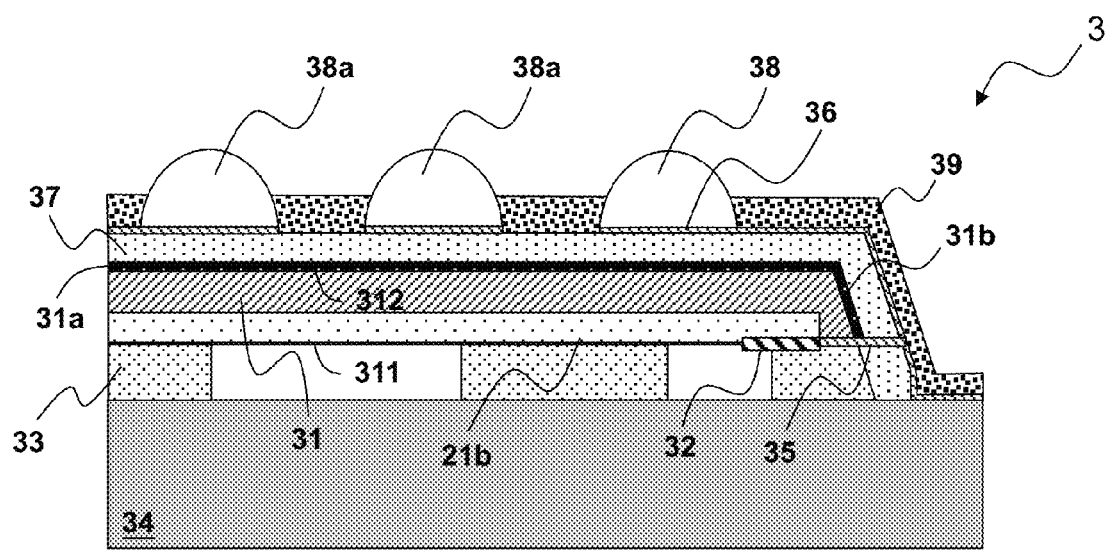
FIG. 3 shows a second embodiment of the present invention.

Please refer to FIG. 3 for a second embodiment according to the present invention. FIG. 3 shows a schematic diagram of a chip package 3 from cross-section view. As shown in FIG. 3, the chip package 3 is for example but not limited to a CSP including the image sensor circuit 21b. The chip package 3 includes: a semiconductor chip 31, a metal heat conductive layer 31a, a metal heat conductive strip 31b, a bond pad 32, a chamber wall 33, an optical glass 34, an electrical conductive pad 35, an electrical conductive wire 36, a barrier solder mask 37, solder balls 38 and 38a, and a solder mask face 39. The semiconductor chip 31 has an upper surface 311 and a lower surface 312. The bond pad 32 is formed on the upper surface 311, for electrically connecting with a circuit in the semiconductor chip 31. An optical image signal passes through the optical glass 34 and a cavity formed by the chamber wall 33 to enter the semiconductor chip 31. The optical image signal is converted to an electronic signal by the circuit operating in the semiconductor chip 31, and the electronic signal is delivered from the bond pad 32, via the electrical conductive pad 35, the electrical conductive wire 36, and the solder balls 38 and 38a, to a PCB (not shown).

This embodiment is different form the first embodiment in that, in this embodiment, the chip package 3 further includes the metal heat conductive strip 31b, which has one end connected to the metal heat conductive layer 31a, and another end indirectly connected to one or more solder ball(s) 38 via the electrical conductive pad 35 and the electrical conductive wire 36 (the number and position (s) of the solder ball(s) 38 shown in the figure are only for example, not for limiting the scope of the present invention). Heat generated by a circuit in the semiconductor chip 3 is conducted to the solder ball 38 (or a lead, as discussed later) via the metal heat conductive layer 31a, the metal heat conductive strip 31b, the electrical conductive pad 35, and the electrical conductive wire 36. Because the metal heat conductive layer 31a, the metal heat conductive strip 31b, the electrical conductive pad 35, the electrical conductive wire 36, and solder ball(s) 38 are metal and are good conductors of heat, the heat generated by the circuit in the semiconductor chip 31 can be dissipated outside the chip package 3. Note that the solder balls 38 and 38a may be replaced by leads or any other electrical connection means in other types of chip package, so the electrical connection is not limited to the form of the solder ball. Besides, the metal heat conductive layer 31a, the metal heat conductive strip 31b, the electrical conductive pad 35, and the electrical conductive wire 36 may have the same electrical level, and a preferable arrangement is to electrically connect them to the same ground level, such that not only the performance of heat dissipation is improved, but also the stability of the circuit operation is improved because the area connected to the ground level is wider.

Figure 4:
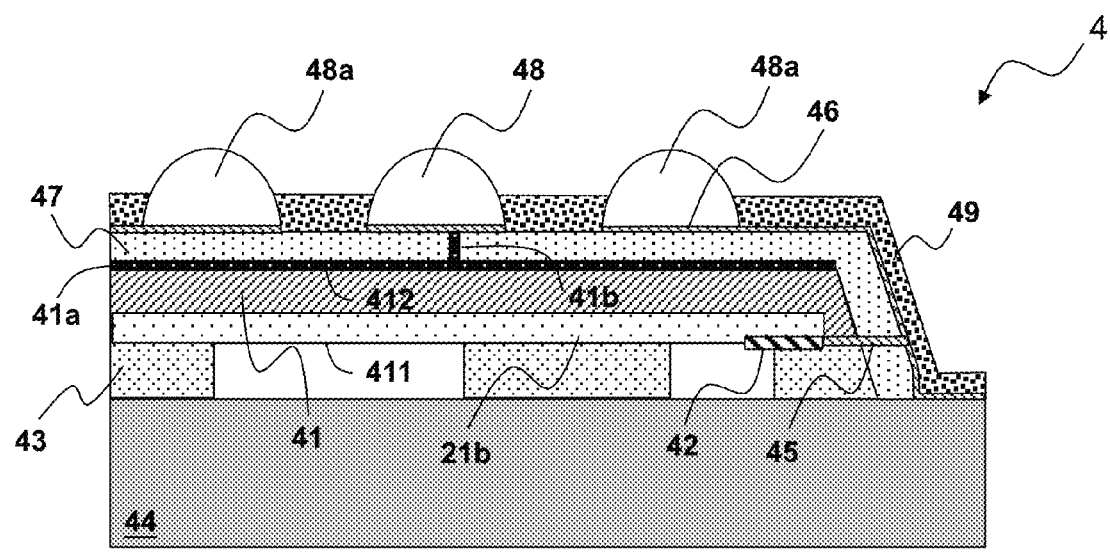
FIG. 4 shows a third embodiment of the present invention.

Please refer to FIG. 4 for a third embodiment according to the present invention. FIG. 4 shows a schematic diagram of a chip package 4 from cross-section view. As shown in FIG. 4, the chip package 4 is for example but not limited to a CSP including the image sensor circuit 21b. The chip package 4 includes: a semiconductor chip 41, a metal heat conductive layer 41a, a metal heat conductive strip 41b, a bond pad 42, a chamber wall 43, an optical glass 44, an electrical conductive pad 45, an electrical conductive wire 46, a barrier solder mask 47, solder balls 48 and 48a, and a solder mask face 49. The semiconductor chip 41 has an upper surface 411 and a lower surface 412. The bond pad 42 is formed on the upper surface 411, for electrically connecting with a circuit in the semiconductor chip 41. An optical image signal passes through the optical glass 44 and a cavity formed by the chamber wall 43 to enter the semiconductor chip 41. The optical image signal is converted to an electronic signal by the circuit operating in the semiconductor chip 41, and the electronic signal is delivered from the bond pad 42, via the electrical conductive pad 45, the electrical conductive wire 46, and the solder balls 48 and 48a, to a PCB (not shown).

This embodiment is different from the second embodiment in that, in this embodiment, the metal heat conductive layer 41a of the chip package 4 is connected to the electrical conductive wire 46 not via the electrical conductive pad 45, but via the metal heat conductive strip 41b, and to one or more the solder ball(s) 48 (the number and position(s) of the solder ball(s) 48 shown in the figure are only for example, not for limiting the scope of the present invention). This embodiment shows that the connection between the metal heat conductive strip and the solder ball can be arranged in various forms, not limited to the form shown in FIG. 3. In this embodiment, because the solder ball 48 which is connected to the metal heat conductive layer 41 does not need to be connected with the electrical conductive pad 45, the solder ball 48 (if it is not connected with the electrical conductive pad 45) does not need to provide an electrical connection (i.e., signal transmission) function and can serve simply for heat dissipation function.

Figure 5A:
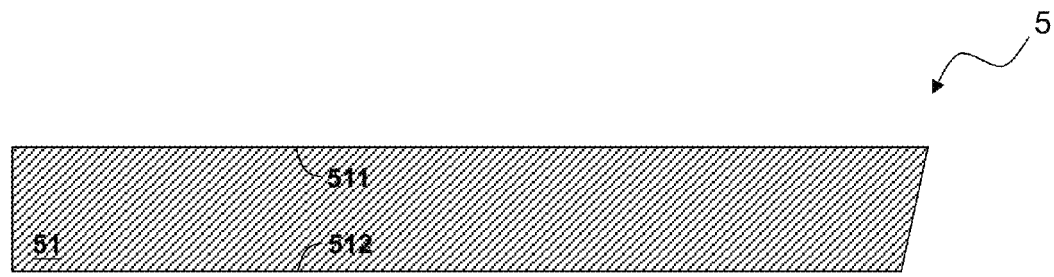
FIGS. 5A-5E shows a fourth embodiment of the present invention.
Figure 5B:
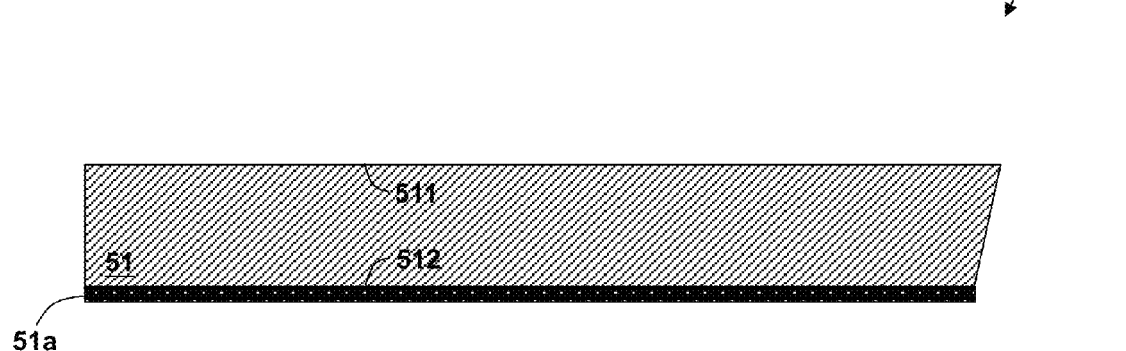
Figure 5C:
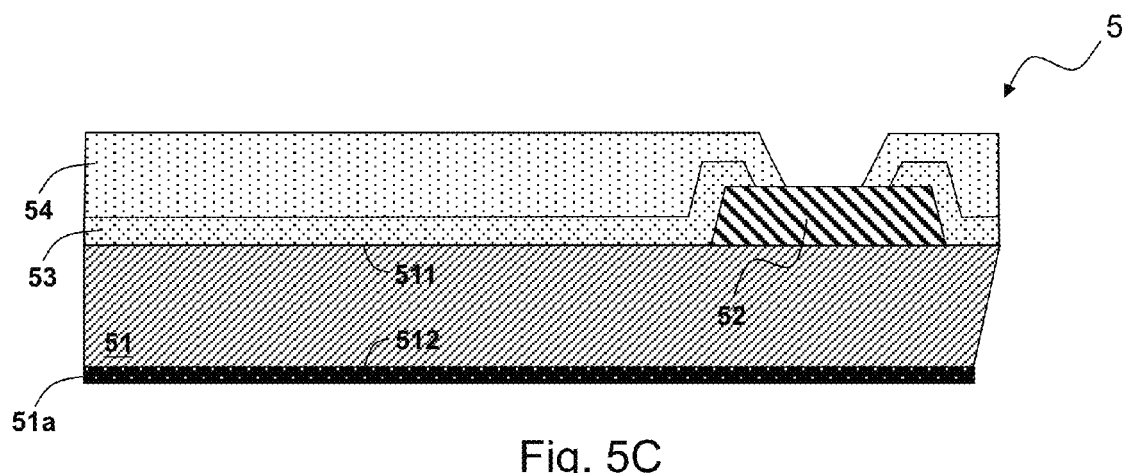
Figure 5D:
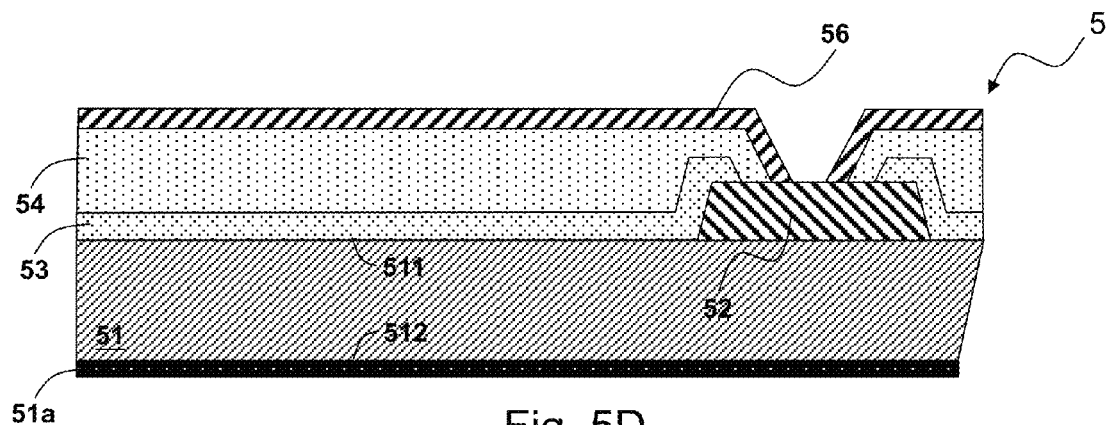
Figure 5E:
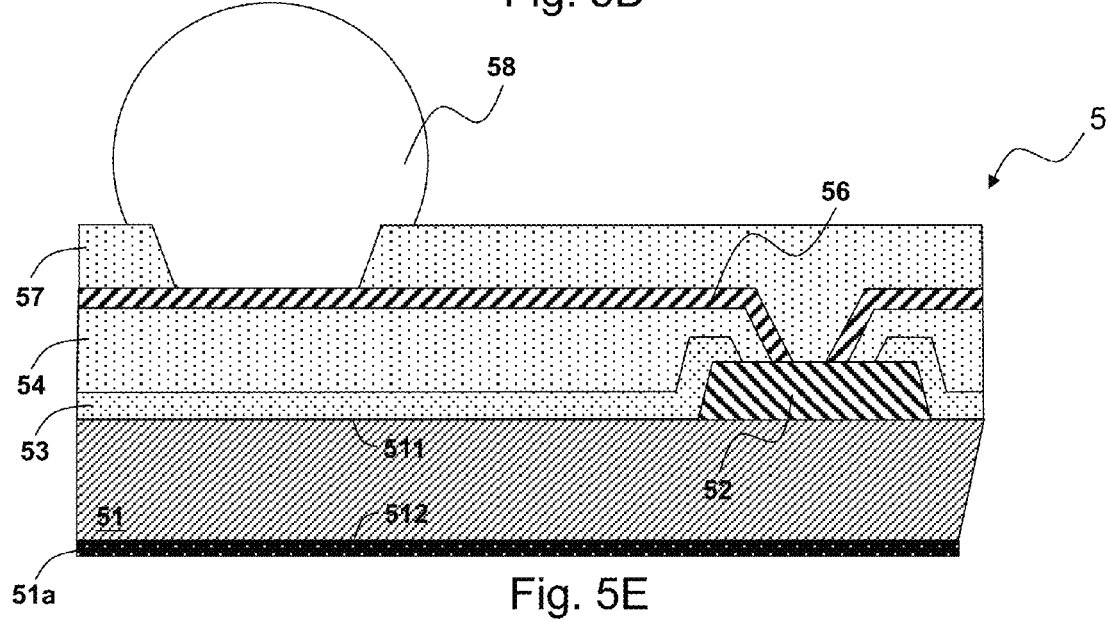

Please refer to FIGS. 5A-5E for a fourth embodiment according to the present invention. FIGS. 5A-5E are schematic diagrams showing a manufacturing method of a chip package 5 from cross-section view. As shown in FIG. 5A, first, a semiconductor chip 51 is provided, which has an upper surface 511 and a lower surface 512 opposite to each other. Next, referring to FIG. 5B, a metal heat conductive layer 51a is formed on the lower surface 512, which is connected to the semiconductor chip 51 for conducting or absorbing heat generated by the semiconductor chip 51. Next, referring to FIG. 5C, a bond pad 52 is formed on the upper surface 511, for electrically connecting with a circuit in the semiconductor chip 51. Next, a passivation layer 53 and an insulating layer 54 are formed on the upper surface 511. Next, referring to FIG. 5D, an electrical conductive wire 56 is formed on the insulating layer 54. Next, referring to FIG. 5E, an insulating layer 57 is formed on the electrical conductive wire 56. Next, a solder ball 58 is formed and electrically connected to the electrical conductive wire 56. This embodiment shows a manufacturing method of the chip package 5 according to the present invention, and it also shows that, as a different embodiment from the previous embodiments, the metal heat conductive layer and the solder ball may be arranged at different sides of the semiconductor chip 51. That is, this embodiment is different from the aforementioned embodiments in that, the solder ball 58 may be formed on the upper surface 511, not on the lower surface 512. This embodiment indicates that the present invention may be applied to different forms of the chip package.

Figure 6:
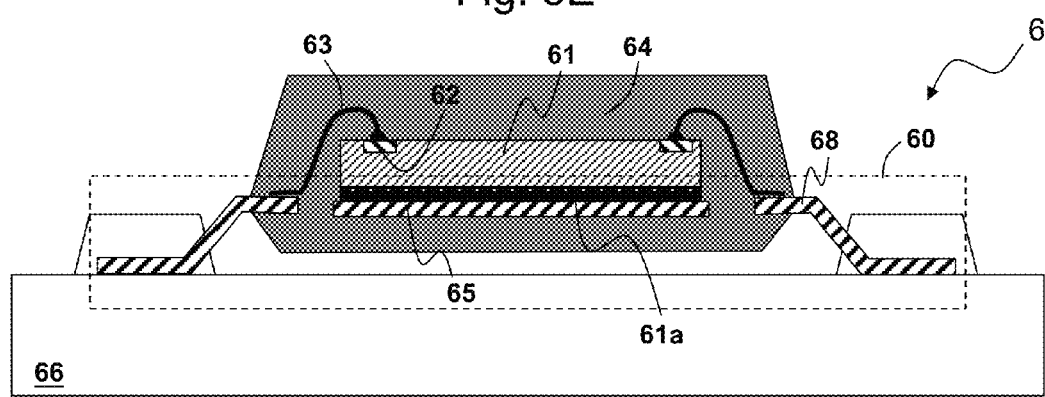
FIG. 6 shows a fifth embodiment of the present invention.

FIG. 6 shows a fifth embodiment of the present invention. This embodiment shows a schematic diagram of a chip package 6 from cross-section view. As shown in FIG. 6, a lead frame 60 includes plural leads 68. The leads 68 are electrically connected to bond pads 62 of a semiconductor chip 61 by wire bonding through plural electrical conductive wires 63, whereby the leads 68 are electrically connected to a circuit in the semiconductor chip 61. As shown in the figure, a metal heat conductive layer 61a is formed on a lower surface of the semiconductor chip 61, and attached to a die paddle 65 in the lead frame 60. By wire bonding, the semiconductor chip 61 is electrically connected to the leads 68 in the lead frame 60 via the electrical conductive wires 63. Next, a molding layer 64 molds the semiconductor chip 61, the lead frame 60, and the electrical wires 63 into a chip package 6. Next, the leads 68 are fixed on a PCB 66, such that the chip package 6 becomes part of the PCB 66.

This embodiment indicates that, the present invention may be applied to another form of the chip package with leads. Heat generated by the semiconductor chip 61 can be conducted to the die paddle 65 via the metal heat conductive layer 61a. The heat generated by the semiconductor chip 61 can also be conducted to the bond pads 62 and the leads 68 by other forms of heat conductive connections (such as by a through silicon via, TSV).

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, in some embodiments the circuit packaged in the chip package is an image sensor circuit, this is only an example and the present invention is not limited thereto; the present invention can be applied to a chip package including other types of circuits. For another example, other process steps or structures which do not affect the primary characteristic of the device, such as a buffer layer, etc., can be added. For another example, the metal heat conductive layer may be formed in the chip packaging process, or in the wafer manufacturing process. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A chip package, comprising:
    a semiconductor chip having an upper surface and a lower surface opposite to each other, the semiconductor chip including an image sensor circuit;
    a metal heat conductive layer formed on the lower surface, for conducting or absorbing heat generated by the semiconductor chip;
    a bond pad formed on the upper surface, for electrically connecting with the image sensor circuit in the semiconductor chip;
    a metal heat conductive strip, which is connected to the metal heat conductive layer; and
    a solder ball or a lead, which is coupled to the metal heat conductive strip;
    whereby heat generated by the image sensor circuit of the semiconductor chip is conducted to the solder ball or the lead via the metal heat conductive layer and the metal heat conductive strip.

2. The chip package of claim 1, wherein the solder ball or the lead is electrically connected to a ground level.

3. A chip package, comprising:
    a semiconductor chip having an upper surface and a lower surface opposite to each other, the semiconductor chip including an image sensor circuit;
    a metal heat conductive layer formed on the lower surface, for conducting or absorbing heat generated by the semiconductor chip; and
    a bond pad formed on the upper surface, for electrically connecting with the image sensor circuit in the semiconductor chip;
    wherein the metal heat conductive layer entirely covers the lower surface.

4. A manufacturing method of a chip package, comprising:
    providing a semiconductor chip having an upper surface and a lower surface opposite to each other, the semiconductor chip including an image sensor circuit;
    forming a metal heat conductive layer on the lower surface, for conducting or absorbing heat generated by the semiconductor chip;
    forming a bond pad on the upper surface, for electrically connecting with the image sensor circuit in the semiconductor chip;
    forming a metal heat conductive strip, which is connected to the metal heat conductive layer; and
    forming a solder ball or a lead, which is coupled to the metal heat conductive strip;
    whereby heat generated by the image sensor circuit of the semiconductor chip is conducted to the solder ball or the lead via the metal heat conductive layer and the metal heat conductive strip.

5. The manufacturing method of claim 4, wherein the solder ball or the lead is electrically connected to a ground level.

6. A manufacturing method of a chip package, comprising:
    providing a semiconductor chip having an upper surface and a lower surface opposite to each other, the semiconductor chip including an image sensor circuit;
    forming a metal heat conductive layer on the lower surface, for conducting or absorbing heat generated by the semiconductor chip; and
    forming a bond pad on the upper surface, for electrically connecting with the image sensor circuit in the semiconductor chip;
    wherein the metal heat conductive layer entirely covers the lower surface.

7. A manufacturing method of a chip package, comprising:
    providing a semiconductor chip having an upper surface and a lower surface opposite to each other, the semiconductor chip including an image sensor circuit;
    forming a metal heat conductive layer on the lower surface, for conducting or absorbing heat generated by the semiconductor chip;
    forming a bond pad on the upper surface, for electrically connecting with the image sensor circuit in the semiconductor chip;
    forming a chamber wall, which is connected to the upper surface; and
    forming an optical glass, which is connected to the chamber wall;
    whereby an optical image signal passes through the optical glass and a cavity formed by the chamber wall to enter the semiconductor chip.

8. A chip package, comprising:
    a semiconductor chip having an upper surface and a lower surface opposite to each other, the semiconductor chip including an image sensor circuit;
    a metal heat conductive layer formed on the lower surface, for conducting or absorbing heat generated by the semiconductor chip;
    a bond pad formed on the upper surface, for electrically connecting with the image sensor circuit in the semiconductor chip;
    a chamber wall, which is connected to the upper surface; and
    an optical glass, which is connected to the chamber wall;

whereby an optical image signal passes through the optical glass and a cavity formed by the chamber wall to enter the semiconductor chip.

9. A chip package, comprising:

a semiconductor chip having an upper surface and a lower surface opposite to each other;

a metal heat conductive layer formed on the lower surface, for conducting or absorbing heat generated by the semiconductor chip;

a bond pad formed on the upper surface, for electrically connecting with a circuit in the semiconductor chip;

a metal heat conductive strip, which is connected to the metal heat conductive layer; and a solder ball or a lead, which is connected to the metal heat conductive layer, but is not directly connected with an electrical conductive pad, wherein the solder ball serves for a heat dissipation function but does not provide an electrical connection function, whereby heat generated by a circuit of the semiconductor chip is conducted to the solder ball or the lead via the metal heat conductive layer and the metal heat conductive strip.

\* \* \* \* \*